US011881492B2

(12) United States Patent
Guidash et al.

(10) Patent No.: US 11,881,492 B2
(45) Date of Patent: Jan. 23, 2024

(54) TRANSISTOR STRUCTURES

(71) Applicant: SEMICONDUCTOR COMPONENTS INDUSTRIES, LLC, Phoenix, AZ (US)

(72) Inventors: Robert Michael Guidash, Fairport, NY (US); Muhammad Maksudur Rahman, Fremont, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 43 days.

(21) Appl. No.: 17/647,931

(22) Filed: Jan. 13, 2022

(65) Prior Publication Data

US 2023/0223412 A1 Jul. 13, 2023

(51) Int. Cl.
*H01L 27/146* (2006.01)
*H04N 25/59* (2023.01)
*H04N 25/75* (2023.01)
*H04N 25/771* (2023.01)

(52) U.S. Cl.
CPC .. *H01L 27/14612* (2013.01); *H01L 27/14643* (2013.01); *H04N 25/59* (2023.01); *H04N 25/75* (2023.01); *H04N 25/771* (2023.01); *H01L 27/1463* (2013.01)

(58) Field of Classification Search
CPC ......... H01L 27/14612; H01L 27/14643; H01L 27/1463; H01L 27/14689; H04N 25/59; H04N 25/75; H04N 25/771
See application file for complete search history.

(56) References Cited

U.S. PATENT DOCUMENTS

| 10,283,558 | B1* | 5/2019 | Manabe | H01L 27/14643 |
| 2004/0002177 | A1 | 1/2004 | Lin et al. | |
| 2007/0057158 | A1* | 3/2007 | Hong | H01L 27/14689 |
| | | | | 250/214.1 |
| 2009/0230444 | A1 | 9/2009 | Ko et al. | |
| 2011/0249158 | A1* | 10/2011 | Hynecek | H01L 27/1461 |
| | | | | 348/277 |
| 2016/0286151 | A1 | 9/2016 | Lahav et al. | |
| 2018/0109746 | A1* | 4/2018 | Hanzawa | H04N 25/60 |
| 2019/0393255 | A1* | 12/2019 | Lee | H01L 27/14623 |

OTHER PUBLICATIONS

Search Report for counterpart DE Application No. 102022132749.3, dated Nov. 9, 2023, 10 pages.

* cited by examiner

*Primary Examiner* — Albert H Cutler
(74) *Attorney, Agent, or Firm* — Treyz Law Group, P.C.; Tianyi He

(57) ABSTRACT

Transistor structures for a transistor may include a first source-drain region, a second source-drain region, and a channel region between the first and second source-drain regions overlapped by a gate structure. Transistor structures may be formed in a well of a first doping type. Isolation structures having the first doping type may be formed within the well. A lightly doped implant region of a second doping type for each of the source-drain regions may be formed within the well and separated from the isolation structures. A heavily doped surface implant region of the first doping type may extend across the surface of the well and cover the lightly doped implant region of each source-drain region. The surface implant region may be formed by patterning or by a blanket implantation process across the transistor structures.

20 Claims, 8 Drawing Sheets

TRANSISTOR STRUCTURES

BACKGROUND

This relates generally to transistor structures, and more particularly, to transistor structures in image sensors or imaging systems.

Image sensors are commonly used in systems or devices to generate image data. In a typical arrangement, an image sensor includes an array of image sensor pixels, each image sensor pixel containing a photodiode for generating charge based on incident light.

Each image sensor pixel includes multiple transistors some of which have source or drain terminals that are configured to integrate and store portions of the photodiode-generated charge. However, these transistor terminals can have high dark current causing high temporal and/or fixed pattern noise (e.g., dark signal non-uniformity), thereby degrading pixel performance and image quality.

It is within this context that the embodiments herein arise.

DETAILED DESCRIPTION

Electronic systems such as cameras, computers, cellular telephones, automotive electronic systems, industrial electronic systems, and other electronic systems can include image sensors that gather incident light to generate image data (e.g., capture one or more images and/or video). The image sensors can include one or more arrays of (active) image sensor pixels. The image sensor pixels can include photosensitive elements such as photodiodes that convert the incident light into image charge. The image sensors can have any number of image sensor pixels (e.g., hundreds or thousands or more). A typical image sensor can, for example, have hundreds of thousands or millions of image sensor pixels (e.g., megapixels). The image sensors can include control circuitry such as circuitry for operating (e.g., controlling the operation of) the image sensor pixels and readout circuitry for reading out image signals corresponding to the image charge generated by the photosensitive elements.

Figure 1:
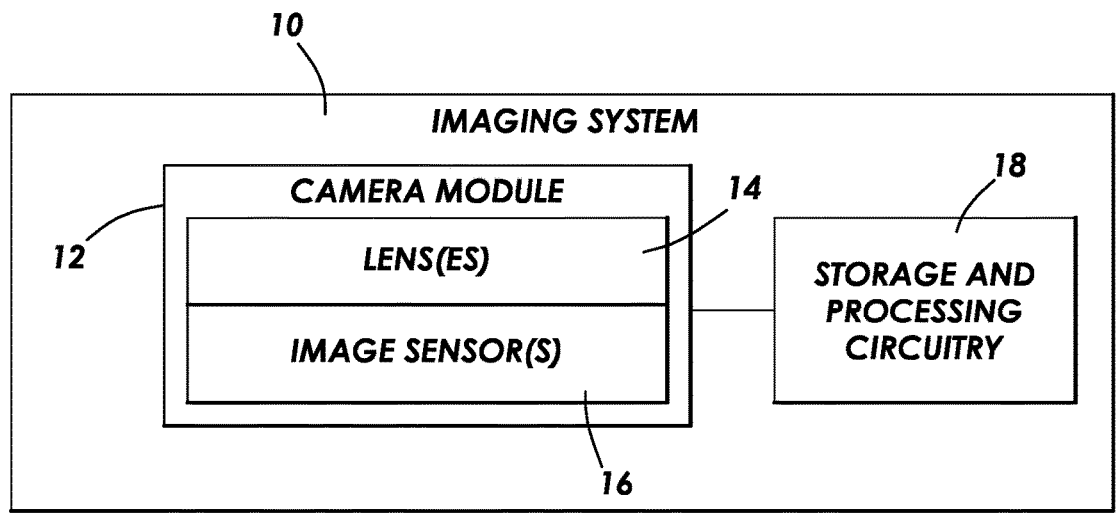
FIG. 1 is a functional block diagram of an illustrative imaging system having one or more image sensors and processing circuitry for generating image data in accordance with some embodiments.

FIG. 1 is a functional block diagram of an illustrative imaging system (e.g., an electronic system with imaging capabilities) such as imaging system 10. Imaging system 10 of FIG. 1 may be (e.g., form part of) a portable electronic device such as a camera, a cellular telephone, a tablet computer, a laptop computer, a webcam, or a video camera, may be other types of imaging systems such as a video surveillance system, an automotive system (e.g., an automotive electronic system, an automotive sensor system, an automotive imaging system, an embedded system in automotive electronics, or any other part of an automotive system), a video gaming system with imaging capabilities, an augmented reality and/or virtual reality system, an unmanned aerial vehicle system (e.g., a drone), or an industrial electronic system, or may be any other suitable imaging systems or devices that generate image data.

Imaging system 10 includes camera module 12 (sometimes referred to as imaging module 12). Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16 and other macro lenses. If desired, camera module 12 may be provided with an array of lenses 14 and an array of corresponding image sensors 16.

During image capture operations, light from a scene may be focused onto image sensor 16 by lenses 14. Image sensor 16 may include circuitry for converting analog pixel image signals into corresponding digital image data that is provided to storage and processing circuitry 18.

Storage and processing circuitry 18 (sometimes referred to herein collectively as control circuitry 18) may include and be implemented on one or more integrated circuits (e.g., one or more integrated circuit dies). As illustrative examples, the processing component of circuitry 18 may include one or more image processing circuits or digital signal processors, one or more microprocessors or microcontroller, one or more (general or special purpose) processors each having one or more processing cores, or any other suitable circuitry for manipulating or processing data. The storage component of circuitry 18 may include non-volatile memory circuitry such as a hard drive, a solid-state drive, read-only memory, and/or any other type of non-volatile memory circuitry, or other data storage devices. If desired, circuitry 18 may include volatile memory such as random-access memory.

In some illustrative configurations described herein as examples, the storage component of circuitry 18 (e.g., non-transitory computer-readable media) stores instructions (e.g., software, firmware, code, etc.) executable by the processing component of circuitry 18. When executed by the processing component of circuitry 18, these instructions can implement one or more processes (e.g., processing schemes, control schemes, etc.) described herein. In such a manner, control circuitry 18 can be configured to control the operations of imaging system 10 (e.g., components such as image sensor 16 or other components within imaging system 10).

Control circuitry 18 may be implemented using components that are separate from camera module 12 and/or that form part of the camera module (e.g., circuits that form part of an integrated circuit that includes image sensor 16 or an integrated circuit within the module that is associated with image sensor 16). When control circuitry 18 is included on different integrated circuits (e.g., chips) than those of one or more image sensors 16, the integrated circuits associated with control circuitry 18 may be stacked to or packaged together with the integrated circuits associated with one or more image sensors 16. Image data that has been generated by camera module 12 may be processed and stored using control circuitry 18 (e.g., using an image processing engine in control circuitry 18, using an imaging mode selection engine in control circuitry 18, etc.). Processed image data may, if desired, be provided to external equipment (e.g., a computer, an external display, an electronics control unit, an external system to which imaging system 10 is a sub-system, or other systems or devices) using wired and/or wireless communications paths coupled to control circuitry 18.

Figure 2:
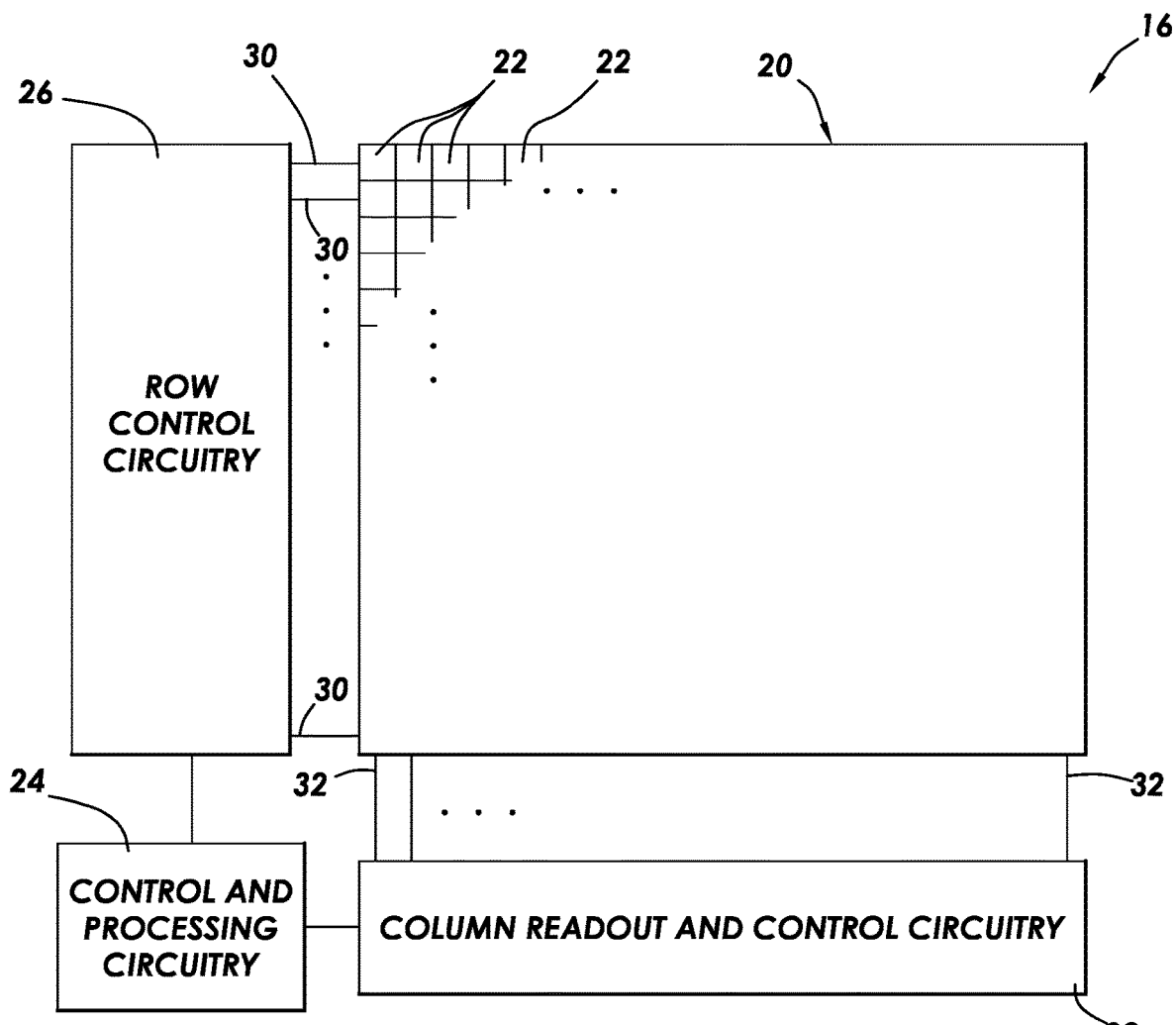
FIG. 2 is a functional block diagram of illustrative image sensor circuitry having a pixel array and control and readout circuitry for the pixel array in accordance with some embodiments.

FIG. 2 is a functional block diagram of an illustrative image sensor such image sensor 16 (e.g., that may be implemented as image sensor 16 in system 10 in FIG. 1). As shown in FIG. 2, image sensor 16 includes a pixel array 20 containing image sensor pixels 22 (sometimes referred to herein as image pixels 22 or pixels 22). In some configurations described herein as illustrative examples, image pixels 22 may be arranged in rows and columns. Array 20 may contain, for example, hundreds or thousands of rows and columns of image pixels 22.

In the example of FIG. 2, image sensor 16 includes control and processing circuitry 24 (sometimes referred to herein as control circuitry 24). Control circuitry 24 is coupled to row control circuitry 26 (sometimes referred to as row driver circuitry 26) and column readout and control circuitry 28 (sometimes referred to as column control circuitry 28, column readout circuitry 28, or readout circuitry 28). Control circuitry 24 may provide timing controls for row control circuitry 26 (e.g., may receive row addresses for which certain control signals are to be asserted or deasserted). Accordingly, based on the timing controls, row control circuitry 26 may supply (e.g., assert or deassert) corresponding row control signals such as reset, anti-blooming, row select, charge transfer, dual conversion gain (e.g., low conversion gain), readout, and/or any other suitable pixel control signals to each row of pixels 22 over one or more conductive paths for that row (e.g., over row control paths 30).

One or more conductive paths such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 can be selected using row control circuitry 26, and image signals generated by image pixels 22 in that pixel row can be read out along column lines 32.

Column readout circuitry 28 may receive image signals (e.g., analog pixel values generated by pixels 22) over column lines 32. Column readout circuitry 28 may include memory circuitry for temporarily storing calibration signals (e.g., reset level signals, reference level signals) and/or image signals (e.g., image level signals) read out from array 20, amplifier circuitry, analog to digital conversion (ADC) circuitry, bias circuitry, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Column readout circuitry 28 may supply the digital pixel data associated with pixels in one or more pixel columns to control and processing circuitry 24 and/or storage and processing circuitry 18 (FIG. 1).

One or more of control and processing circuitry 24, row control circuitry 26, and column readout and control circuitry, may be referred to herein as control circuitry (for image sensor 16). In particular, the control circuitry may be configured to control the operation (e.g., a shutter operation, a charge integration operation, a readout operation, etc.) of one or more pixels 22 in array 20 in generating image data (e.g., analog image signals and subsequently digital image data). The control circuitry may include associated storage circuitry (e.g., non-transitory computer-readable media) configured to store instructions (e.g., software, firmware, code, etc.) executable by the processing component of the control circuitry. When executed by the processing component of the control circuitry, these instructions can implement one or more processes (e.g., processing schemes, control schemes, etc.) described herein (e.g., one or more timing diagrams for controlling one or more pixels 22 in array 20). In such a manner, the control circuitry can be configured to control the operations of pixels 22 and/or other components in image sensor 16.

Additionally, pixel array 20 may be provided with a filter array having multiple (color) filter elements (each corresponding to one or more respective pixels) which allows a single image sensor to sample light of different colors or sets of wavelengths. As an example, image sensor pixels 22 in array 20 may be provided with a color filter array having red, green, and blue filter elements, which allows a single image sensor to sample red, green, and blue (RGB) light using corresponding red, green, and blue image sensor pixels arranged in a Bayer mosaic pattern. As another example, the green pixels in a Bayer pattern may be replaced by broadband image pixels having broadband color filter elements (e.g., clear color filter elements, yellow color filter elements, etc.). In yet another example, one of the green pixels in a Bayer pattern may be replaced by infrared (IR) image pixels formed under IR filter elements and/or the remaining red, green, and blue image pixels may also be sensitive to IR light (e.g., may be formed under filter elements that pass IR light in addition to light of their respective colors). These examples are merely illustrative. In general, filter elements of any desired color and/or wavelength and in any desired pattern may be formed over any desired number of image pixels 22.

Figure 3:
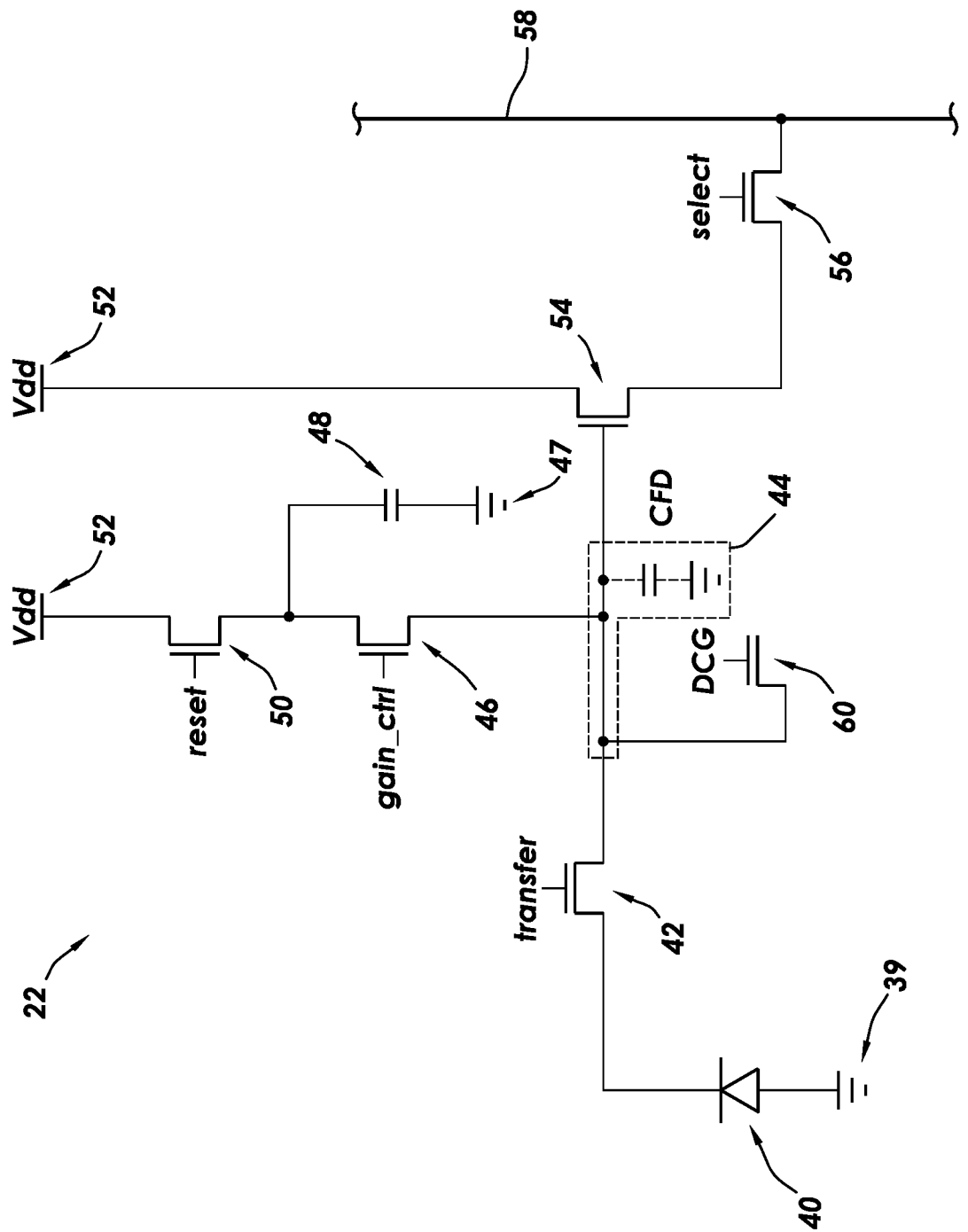
FIG. 3 is a circuit diagram of an illustrative image pixel having first and second conversion gain devices coupled to a floating diffusion region in accordance with some embodiments.

FIG. 3 is a circuit diagram of an illustrative image sensor pixel such as image sensor pixel 22 (e.g., that may be implemented as one or more image sensor pixels 22 in FIG. 2). As shown in FIG. 3, pixel 22 includes a photosensitive element such as photodiode 40 (e.g., a pinned photodiode with a pinning voltage). Photodiode 40 has a first terminal coupled to a voltage terminal 39 that receives a reference voltage (e.g., a ground voltage) and a second terminal at which image charge is stored. Photodiode 40 may generate charge (e.g., electrons) in response to receiving incident light (e.g., impinging photons). The amount of charge that is generated by photodiode 40 may depend on the exposure duration (or integration time) and the intensity of the incident light (e.g., in a high-light environment, in a mid-light environment, in a low-light environment, etc.).

Pixel 22 in FIG. 3 also includes a floating diffusion region such as floating diffusion region 44. Floating diffusion region 44 may be a doped semiconductor region (e.g., a region in a silicon substrate that is doped by ion implantation, impurity diffusion, or any other doping process). Accordingly, floating diffusion region 44 may have an associated charge storage capacity (e.g., schematically shown as a capacitor having capacitance $C_{FD}$ in FIG. 3). Photodiode-generated charge and/or other charge (e.g., reset voltage level charge, dark current charge, etc.) may be generate on, transferred to and stored at floating diffusion region 44 for one or more pixel readout operations.

In the example of FIG. 3, charge transfer transistor 42 receiving control signal 'transfer' at its control (gate) terminal may couple photodiode 40 (at its first source-drain terminal) to floating diffusion region 44 (at its second source-drain terminal). Transistor 42 may therefore be activated (when control signal 'transfer' is asserted, fully or partially) to transfer photodiode-generated charge to floating diffusion region 44.

For high dynamic range applications, it may be desirable to extend the storage capacity of floating diffusion region 44 and operate pixel 22 in a low (conversion) gain mode of (readout) operation by including a low (conversion) gain charge storage structure. As shown in FIG. 3, pixel 22 includes a charge storage structure such as capacitor 48 (e.g., a low gain capacitor). Capacitor 48 has a first terminal coupled to a voltage terminal 47 and a second terminal that serves as its charge storage terminal. Voltage terminal 47 may provide a fixed voltage (e.g., a ground or supply voltage) or may provide a controllable variable voltage signal (e.g., exhibiting a first voltage across a first time period and exhibiting a second voltage across a second period of time).

Capacitor 48 is coupled to floating diffusion region 44 by transistor 46 receiving control signal 'gain_ctrl' at its control terminal. When transistor 46 is activated (e.g., when control signal 'gain_ctrl' is asserted), capacitor 48 may be electrically connected to floating diffusion region 44, thereby extending the charge storage capacity (capacitance $C_{FD}$) of floating diffusion region 44. Additionally, when transistors 42 and 46 are both activated (e.g., when control signals 'transfer' and 'gain_ctrl' are both partially asserted), (a portion of) photodiode-generated charge may be transferred from photodiode 40 to capacitor 48.

To reset one or more pixel elements (e.g., to a reset voltage level), pixel 22 may include one or more reset transistors such as transistor 50 receiving control signal 'reset' at its control terminal. As shown in FIG. 3, transistor 50 couples a voltage terminal 52 that receive a reference voltage (e.g., a power supply voltage associated with a reset voltage level) to floating diffusion region 44 (via intervening transistor 46). In particular, when transistors 46 and 50 are both activated (e.g., when control signals 'reset' and gain_ctrl' are both asserted), floating diffusion region 44 may be reset to a reset voltage level (e.g., a power supply voltage). Additionally, transistor 50 couples capacitor 48 to voltage terminal 52, and as such, when activated, also resets capacitor 48 to the reset voltage level. Transistor 50, when activated along with transistors 42 and 46 (by asserting their corresponding control signals), may also reset photodiode 40 to a photodiode reset voltage level.

Pixel 22 in FIG. 3 also includes source follower transistor 54 (coupled to voltage terminal 52) and pixel select (or row select) transistor 56 that form the readout (circuitry) portion of pixel 22. In particular, select transistor 56 has a control (gate) terminal that is controlled by control signal 'select'. When control signal 'select' is asserted and transistor 56 is activated, a corresponding pixel output signal having a magnitude that is proportional to the amount of charge at floating diffusion region 44 is passed onto a pixel output path such as column line 58 (e.g., line 32 in FIG. 2) via source follower transistor 54. When floating diffusion region 44 stores photodiode-generated charge that is being read out, the corresponding pixel output signal may be referred to as an image (level) signal. When floating diffusion region 44 stores reset voltage level charge that is being read out, the corresponding pixel output signal may be referred to as a reset level signal.

In an illustrative image pixel array configuration, there are numerous rows and columns of pixels 22. A column line 58 may be associated with each column of pixels 22 (e.g., each image pixel 22 in a column may be coupled to the same column line 58 through a corresponding row select transistor 62). Control signal 'select' may be asserted to read out a pixel output signal from a selected image pixel 22 onto column line 58. The pixel output signal may be provided to readout circuitry 28 (FIG. 2), and thereafter, to processing circuity 18 (FIG. 1) for further processing.

An image sensor having an array of image pixels may operate in varying light conditions (e.g., in a relatively low-light environment, in a relatively high-light environment, in an intermediate (mid) light environment between the low- and high-light environment, etc.). In some applications (e.g., for high dynamic range applications), it may be desirable for the image pixel to generate more than one image signal (e.g., two image signals, three image signals, etc.) for each integration cycle (e.g., for each integration time period). In other words, these image signals may be read out in two or more read out operations with varying gains.

In one illustrative example, an illustrative image pixel may be configured to separate the generated image charge into an overflow portion (sometimes referred to herein as overflow charge) and a remaining portion that remains (is stored) at the photodiode (sometimes referred to herein as remaining photodiode charge). In one illustrative readout scheme, the overflow charge is readout in a low (conversion) gain readout operation in which a low gain capacitor (such as capacitor 48) is used, and the remaining photodiode charge is read out both in a high (conversion) gain readout operation (to desirably use the low noise characteristic of the high gain readout operation) and in a low gain readout operation (to desirably use the large full well capacity characteristic of the low gain readout operation). This illustrative operating scheme may help balance the different considerations associated with reading out different image signals using low and high (conversion) gain readout operations.

However, in some scenarios (e.g., when the ratio between the high conversion gain setting and the low conversion gain is too large), the above illustrative pixel and operating scheme become less attractive as the uncorrelated double sampling readout noise of the low gain readout operations becomes undesirably high, thereby degrading the transition SNR (signal-to-noise ratio) at the transition between low light and high light (e.g., the transition between the low gain response and the high gain response).

To mitigate or circumvent these issues while still providing high dynamic range (e.g., maintain a high ratio between low and high conversion gains), an image pixel may be configured to perform a medium conversion gain readout operation (in addition to a high conversion gain readout operation and a low conversion gain readout operation). Still referring to FIG. 3, pixel 22 may additionally include a conversion gain device such as conversion gain device 60 (sometimes referred to herein as dual or medium conversion gain device 60 or charge storage structure 60) to mitigate or circumvent these above issues. In pixel 22, both device 60 and charge storage structure 48 (e.g., capacitor 48) are configured to be selectively connected, separately or in combination, to floating diffusion region 44 to modify the storage capacity (e.g., capacitance $C_{FD}$) of floating diffusion region 44.

In the example of FIG. 3, device 60 is a two-terminal device. A first terminal of device 60 may be electrically connected to floating diffusion region 44. A second terminal of device 60 may be a gate terminal receiving control signal 'DCG'. When device 60 is activated (e.g., when control signal 'DCG' is asserted), device 60 may be configured to provide an additional capacitance to floating diffusion region 44 (e.g., extending its effective storage capacity). Device 60 may be a semiconductor device (e.g., include a MOS (metal-oxide-semiconductor) capacitor or a modified MOS transistor that provides the desired capacitance for device 60 to be connected to floating diffusion region 44) or may be any other suitable type of device that can selectively modify (e.g., increase) the capacitance at floating diffusion region 44. As an example, the capacitance of device 60 may be exhibited by a gate structure (e.g., receiving control signal 'DCG') and a semiconductor substrate (body) separated by an insulator (e.g., a gate insulator).

In configurations described herein as an example, the capacitance of charge storage structure 48 may be at least ten times larger than the capacitance of floating diffusion region 44 and may be at least 2 times larger than the capacitance of device 60. In such a manner, charge storage structure 48 may be configured to support the low (conversion) gain mode of (readout) operation for pixel 22 and device 60 may be configured to support medium (conversion) gain mode of (readout) operation for pixel 22.

In general, pixel 22 in FIG. 3 may be configured to readout image signals using a low conversion gain readout (e.g., when at least charge storage structure 48 is connected to floating diffusion region 44), using a medium conversion gain readout operation (e.g., when the capacitance exhibited by conversion gain device 60 is connected to floating diffusion region 44), and using a high conversion gain readout (e.g., when charge storage structure 48 and the capacitance exhibited by conversion gain device 60 are both disconnected from floating diffusion region 44).

An image sensor pixel, such as pixel 22 in FIG. 3, a pixel similar to pixel 22 in FIG. 3 that omits device 60 and/or other elements, or pixels of other configurations, can include one or more transistors that include source or drain regions (terminals) configured to integrate (collect) and store image charge. As an example, in connection with FIG. 3, transistor 46 may have a first source-drain terminal (i.e., one of a source terminal or a drain terminal) coupled to floating diffusion region 44 that integrates and stores overflow charge (among other charge) and a second source-drain terminal (i.e., the other one of the source terminal or the drain terminal) coupled to a storage terminal of capacitor 48 that integrates and stores overflow charge. In other words, pixel floating diffusion region 44 may be formed at (e.g., be (directly) electrically connected to) the first source-drain region of the transistor, while pixel capacitor 46 may have a terminal formed at (e.g., be (directly) electrically connected to) the second source-drain region of the transistor. However, these source and drain terminals of transistor 46 may be susceptible to high dark current and fixed pattern noise (e.g., dark signal non-uniformity) that corrupt the charge from incident light stored at these terminals, thereby degrading image quality. While pixel 22 and transistor 46 in FIG. 3 are sometimes described herein to exhibit these above-mentioned issues, this is merely illustrative. Pixels and pixel transistors of other types may also exhibit these issues and may similarly make use of the illustrative embodiments described herein.

To mitigate the above-mentioned issues (e.g., to reduce dark current and resulting fixed pattern noise at source-drain terminals of transistors), transistor structures may include one or more features described in connection with FIGS. 4-9.

Figure 4:
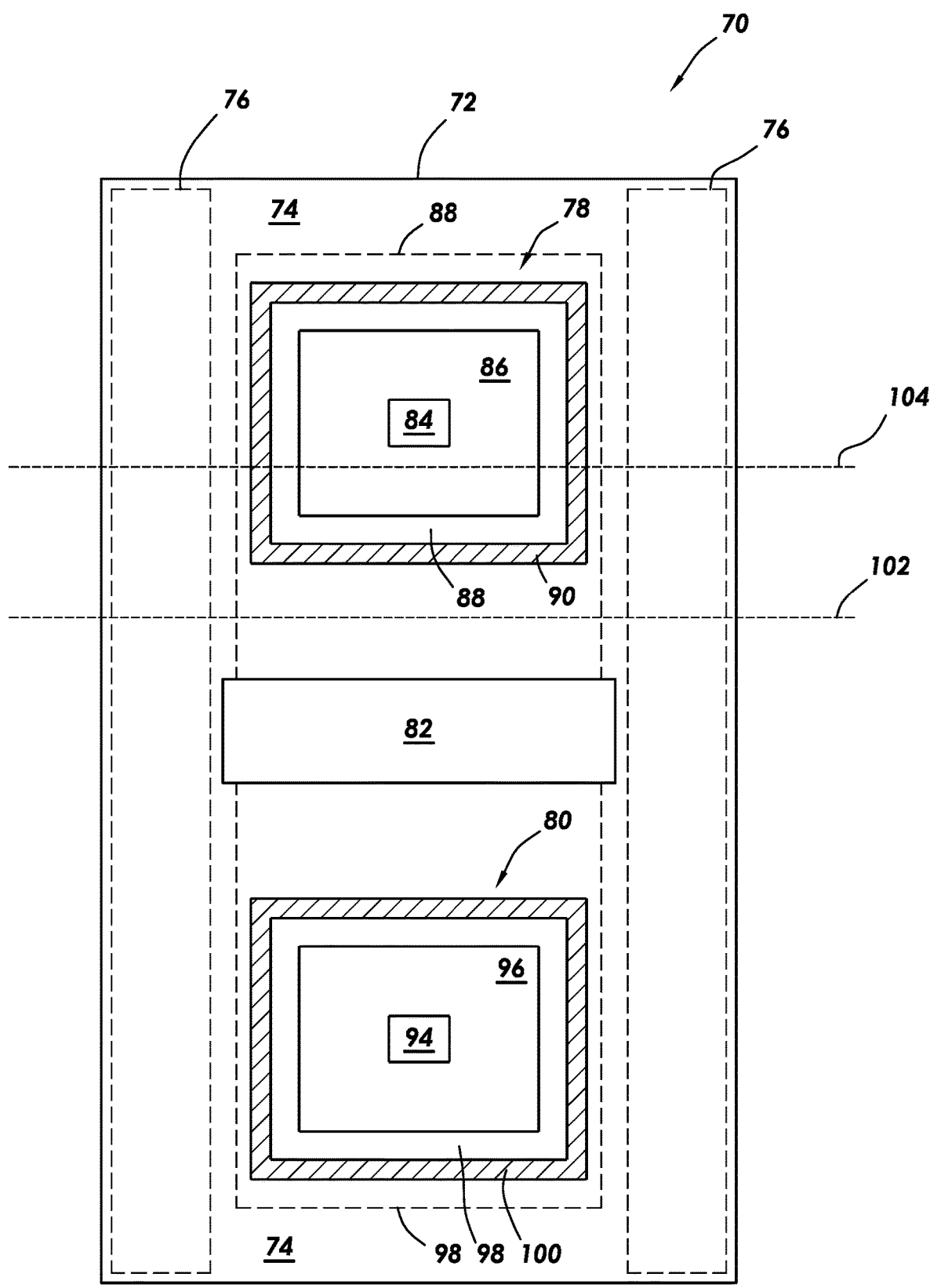
FIGS. 4-6 are diagrams of illustrative transistor structures with a patterned surface implant region in a substrate in accordance with some embodiments.

In particular, FIG. 4 is a top-down view of transistor structures 70 for implementing a transistor such as transistor 46 or any other suitable transistor (e.g., within a pixel or outside a pixel). Transistor structures 70 in FIG. 4 may form a single transistor such as a field-effect transistor and may therefore be sometimes referred to herein as simply as a transistor or field-effect transistor. Transistor 70 may include structures formed on a semiconductor substrate 72 (e.g., formed from one or more semiconducting materials such as silicon). FIG. 4 merely illustrates a portion of substrate 72 (e.g., the portion of substrate 72 at which transistor structures 70 are formed). If desired, other active and/or passive elements (e.g., pixel elements such as photodiodes, other transistors, etc.) may also be formed on other portions of substrate 72.

As shown in FIG. 4, an implant layer such as implant layer 74 (sometimes referred to herein as implant region 74) may be disposed at the surface of substrate 72. Implant region 74 may be formed from a portion of semiconductor substrate 72 that is heavily doped and exhibits a first doping type (e.g., p-type). As an example, implant region 74 may be an implant region with p+ doping. If desired, implant region 74 may formed by a shared implant process step used to form other pixel features, a separate or dedicated implant process step just for forming region 74, or a combination of implant processes (e.g., shared and/or dedicated).

Implant region 74 may overlap isolation structures 76, which are completely embedded within substrate 72. In other words, implant region 74 is on top of and covers isolation structures 76 from a top-down view of substrate 72. The outline of isolation structure 76 underneath implant region 74 is therefore shown in dashed lines in FIG. 4. Isolation structures 76 may be formed from portions of semiconductor substrate 72 that are moderately doped and exhibit the first doping type (e.g., p-type). As an example, isolation structures 76 may be formed using implant regions with p doping sometimes referred to as isolation regions with p doping. If desired, isolation structures 76 may be formed from other isolation or insulating materials such as silicon dioxide, silicon nitride, etc., or formed from shallow trench isolation structures. Isolation structures 76 are formed on opposing (e.g., left and right in FIG. 4) sides of transistor elements 78, 80, and 82. In some illustrative configurations where transistor 70 is implemented in an image sensor pixel, isolation structures 76 may separate or isolate one or more transistor structures 70 from other adjacent pixel structures such as a photosensitive region or element in the image sensor pixel and/or in an adjacent image senor pixel.

Element 78 may be a first source-drain (terminal) region (i.e., one of a source region or a drain region) of transistor 70. Element 80 may be a second (terminal) source-drain region (i.e., the other one of the source region or the drain region) of transistor 70. Element 82 may be a gate structure of transistor 70 between the source and drain regions of transistor 70.

In the example of FIG. 4, source-drain region 78 includes a (metal) contact structure such as source-drain contact 84 on top of substrate 72. Source-drain region 78 also includes implant region 86 formed from a portion of semiconductor substrate 72 that is heavily doped and exhibits a second doping type (e.g., n-type). As an example, region 86 may be an implant region with n+ doping. Implant region 86 may be formed and embedded in the surface of substrate 72, while contact 84 is disposed on top of implant region 86 to form an electrical connection (e.g., an ohmic contact).

Source-drain region 78 also includes lightly doped implant region 88 (sometimes referred to as a lightly doped drain (LDD) region or a lightly doped source region depending on the type of source-drain region 78) formed from a portion of semiconductor substrate 72 that is lightly doped and exhibits the second doping type (e.g., n-type). As an example, region 88 may be an implant region with n– doping. Region 88 may be embedded in substrate 72, with only a portion being formed at or reaching the surface of substrate 72. The portion of region 88 at the surface of substrate 72 may laterally surround region 86. In other words, implant region 86 may overlap or may be formed on implant region 88. The remaining embedded portion of region 88 may be overlapped or covered by implant region 74 at the surface of substrate 72. The interface or junction between the surface portion of implant region 88 and implant region 74 may form surface depletion region 90. In other words, surface depletion region 90, shown in FIG. 4 as a shaded region, is formed from an interfacial portion of implant region 88 and an interfacial portion of implant region 74. The outline of the embedded portion is shown by the dashed outline of region 88. As shown in FIG. 4, the embedded portion of region 88 extends to the channel region of transistor 70 beneath gate structure 82.

Similarly, in the example of FIG. 4, source-drain region 80 includes a (metal) contact structure such as source-drain contact 94 on top of substrate 72. Source-drain region 80 also includes implant region 96 formed from a portion of semiconductor substrate 72 that is heavily doped and exhibits the second doping type (e.g., n-type). As an example, region 96 may be an implant region with n+ doping. Implant region 96 may be formed and embedded in the surface of substrate 72, while contact 94 is disposed on top of implant region 96 to form an electrical connection (e.g., an ohmic contact).

Source-drain region 80 also includes lightly doped implant region 98 (sometimes referred to as a lightly doped drain (LDD) region or a lightly doped source region depending on the type of source-drain region 80) formed from a portion of semiconductor substrate 72 that is lightly doped and exhibits the second doping type (e.g., n-type). As an example, region 98 may be an implant region with n– doping. Region 98 may be embedded in substrate 72, with only a portion being formed at or reaching the surface of substrate 72. The portion of region 98 at the surface of substrate 72 may laterally surround region 96. In other words, implant region 96 may overlap or may be formed on implant region 98. The remaining embedded portion of region 98 may be overlapped or covered by implant region 74 at the surface of substrate 72. The interface or junction between the surface portion of implant region 98 and implant region 74 may form surface depletion region 100. In other words, surface depletion region 100, shown in FIG. 4 as a shaded region, is formed from an interfacial portion of implant region 98 and an interfacial portion of implant region 74. The outline of the embedded portion is shown by the dashed outline of region 98. As shown in FIG. 4, the embedded portion of region 98 extends to the channel region of transistor 70 beneath gate structure 82.

In particular, gate structure 82 may overlap a channel region of transistor 70 embedded in substrate 72. A gate insulator may separate gate structure 82 (e.g., a gate formed from polysilicon or other conductive material) from the channel region. The channel region may be formed at the surface of substrate 72, while the gate insulator and conductive gate may be disposed on top of the surface of substrate 72. As an example, transistor 70 may be an n-channel transistor (e.g., in a configuration where structures in transistor 70 are formed in a p-type well or a p-type substrate).

Implant region 74 at the surface of substrate 72 may be a patterned implant layer. In particular, one or more masking layers may be used to cover implant regions 86, 88 (a suitable portion of region 88), 96, and 98, while dopants are incorporated into substrate 72 outside of these implant regions to form surface implant region 74.

Figure 5:
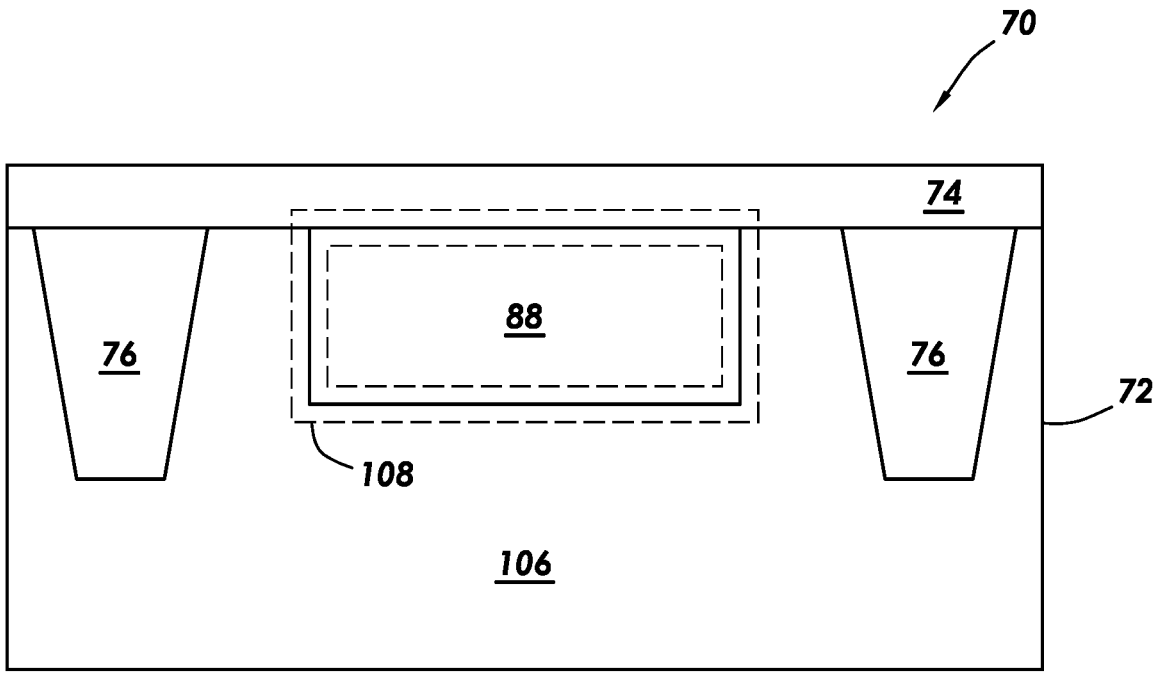
Figure 6:
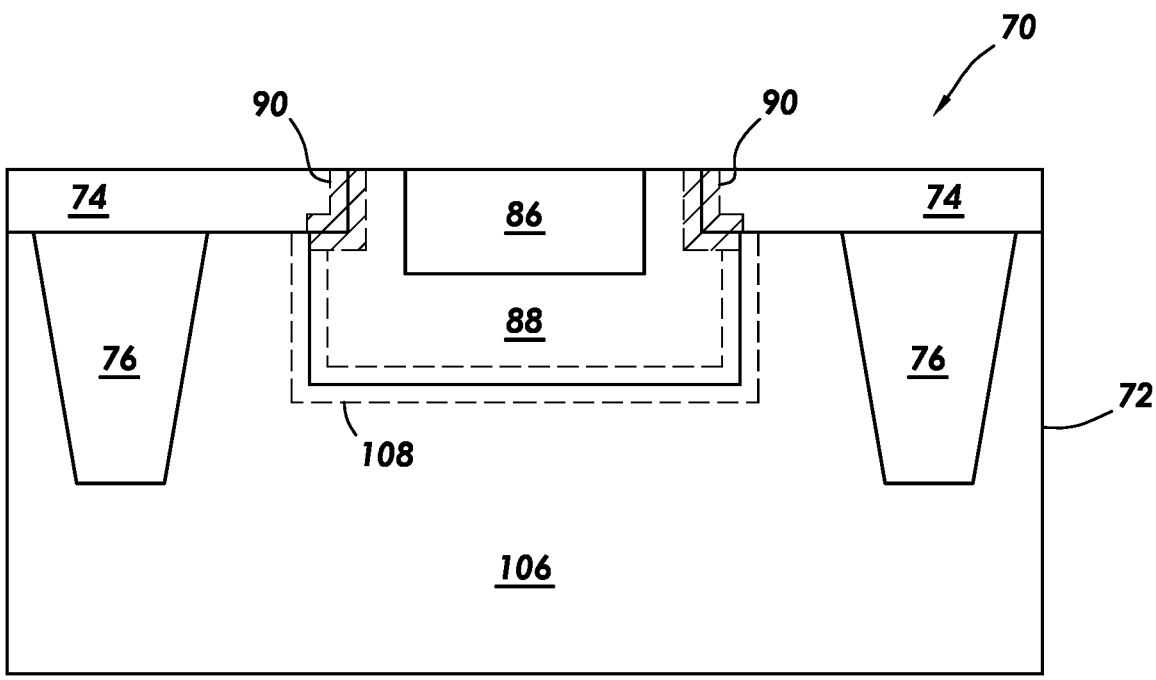

Cross-sectional views of transistor 70 in FIG. 4 are shown in FIGS. 5 and 6. FIG. 5 is a cross-sectional view of transistor 70 in FIG. 4 along line 102. As shown in FIG. 5, semiconductor substrate 72 may include a well of the first doping type such as well 106. Features of transistor 70 may be formed within well 106. As an example, well 106 may be a p-type well formed as a part of a p-type substrate (e.g., substrate 72 is lightly doped with p-type material and itself forms well 106) or formed within a n-type substrate (e.g., substrate 72 is lightly doped with n-type material and a p-type implant region in substrate 72 forms well 106).

Implant region 88 and isolation structures 76 may be formed in well 106. Opposing lateral sides (left and right sides in FIG. 5) of implant region 88 may be separated from isolation structures 76 by corresponding interposing portions of well 106. Implant region 74 may be disposed at the surface of well 106 (e.g., at the surface of substrate 72) and overlap implant region 88 and isolation structures 76. Depletion region 108 (between the dashed lines) may be formed at the interface or junction between implant region 74 and well 106 having a first doping type (e.g., p-type doping), and implant region 88 having a second doping type (e.g., n-type doping).

FIG. 6 is a cross-sectional view of transistor 70 in FIG. 4 along line 104. As shown in FIG. 6, near the region at which contact to source-drain region 78 is made, implant layer 74 may define an opening at the surface of well 106 (e.g., at the surface of substrate 72) in which implant regions 86 and 88 are disposed. In particular, implant region 88 may surround implant region 86 along its lateral sides and underneath implant region 86. Surface depletion region 90 may be formed at the lateral interface or junction between the portion of implant region 88 at the surface and implant region 74. Additional depletion region 108 (as similarly described in connection with FIG. 5) may be embedded within substrate 72.

While FIGS. 5 and 6 illustrative cross-sectional views associated with source-drain region 78, the corresponding portions of source-drain region 80 may have analogous cross-sectional views.

Illustrative transistor configurations for transistor 70 as illustrated in FIGS. 4-6 may help to provide improved transistor features to, as an example, provide transistor terminals with reduced dark current and reduced dark signal non-uniformity. As an example, transistor 70 includes lightly doped implant regions 88 and 98 that are spaced away from isolation structures 76 (e.g., portions of well 106 are interposed between the lightly-doped implant regions and the isolation structures). This helps reduce junction electric field effects between the lightly-doped implant regions and the isolation structures. As another example, transistor 70 includes a surface implant layer 74 (e.g., implant layer at the surface of well 106 or substrate 70) that is formed over a substantial portion of lightly doped implant regions 88 and 98. This helps prevent the depletion region at the junction of lightly doped implant regions from reaching the substrate or well surface along the entire periphery of the lightly doped implant regions and also helps passivate the silicon and silicon dioxide interface over most of the lightly doped implant regions. As yet another example, transistor 70 includes heavily doped implant regions 86 and 96 that are spaced away from surface implant layer 74, from isolation structures 76, and from gate structure 82 (e.g., by portions of lightly doped implant regions and well 106). This further helps reduce junction electric field effects (between the source-drain regions, and isolation structures 76 or surface implant layer 74) and helps reduce gate induced drain leakage. These features may be implemented separately or in (any) combination in an illustrative transistor (e.g., in the combination as depicted for transistor 70 in FIG. 4).

If desired, to further reduce the surface depletion region for the lightly doped implant regions, to further improve passivation of silicon and silicon oxide interface for the lightly doped implant regions, and/or to reduce the number of mask layers or the complexity in forming surface implant layer 74, a transistor may include a blanket surface implant layer 74.

Figure 7:
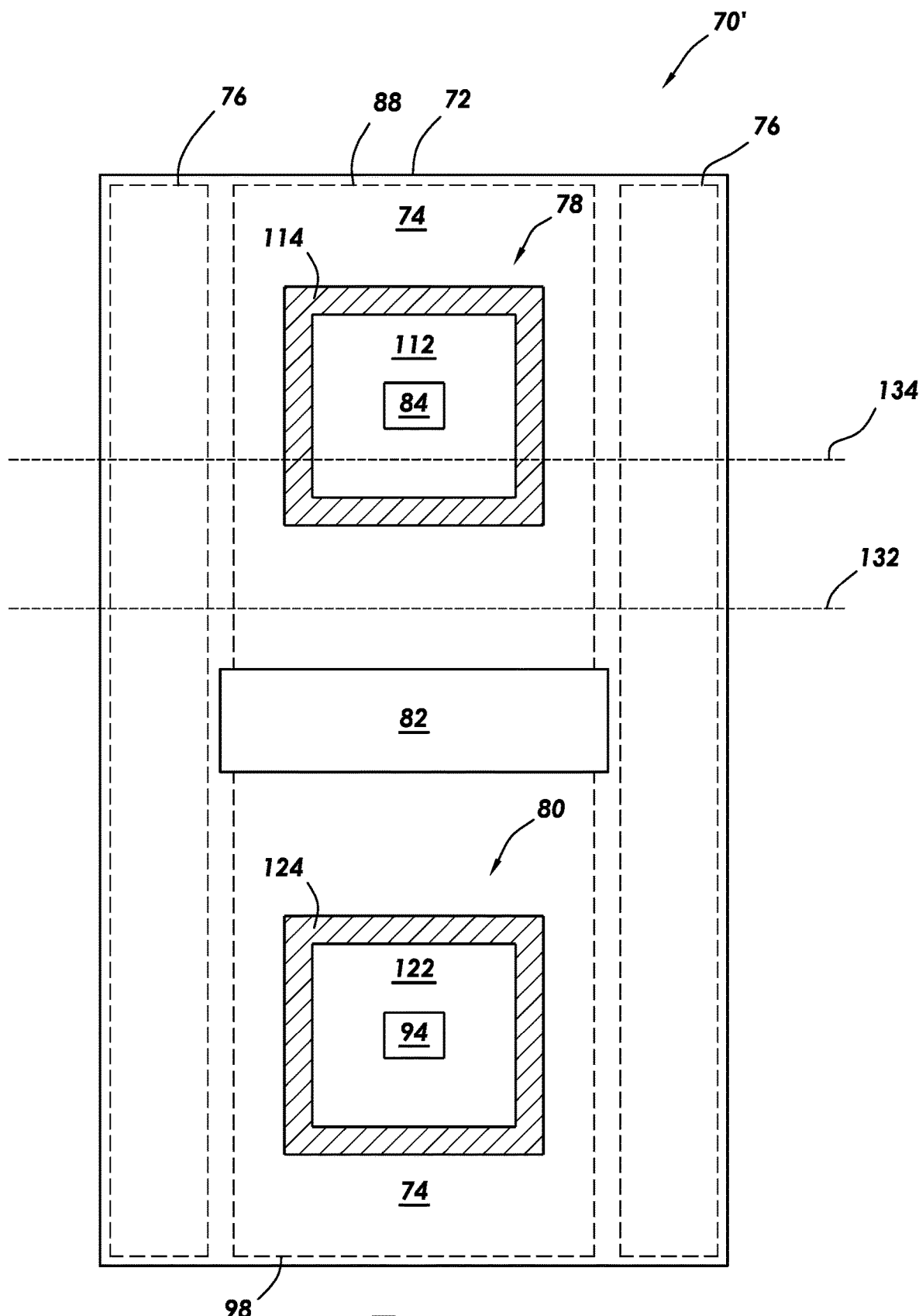
FIGS. 7 and 8 are diagrams of illustrative transistor structures with a blanket surface implant region in a substrate in accordance with some embodiments.
Figure 8:
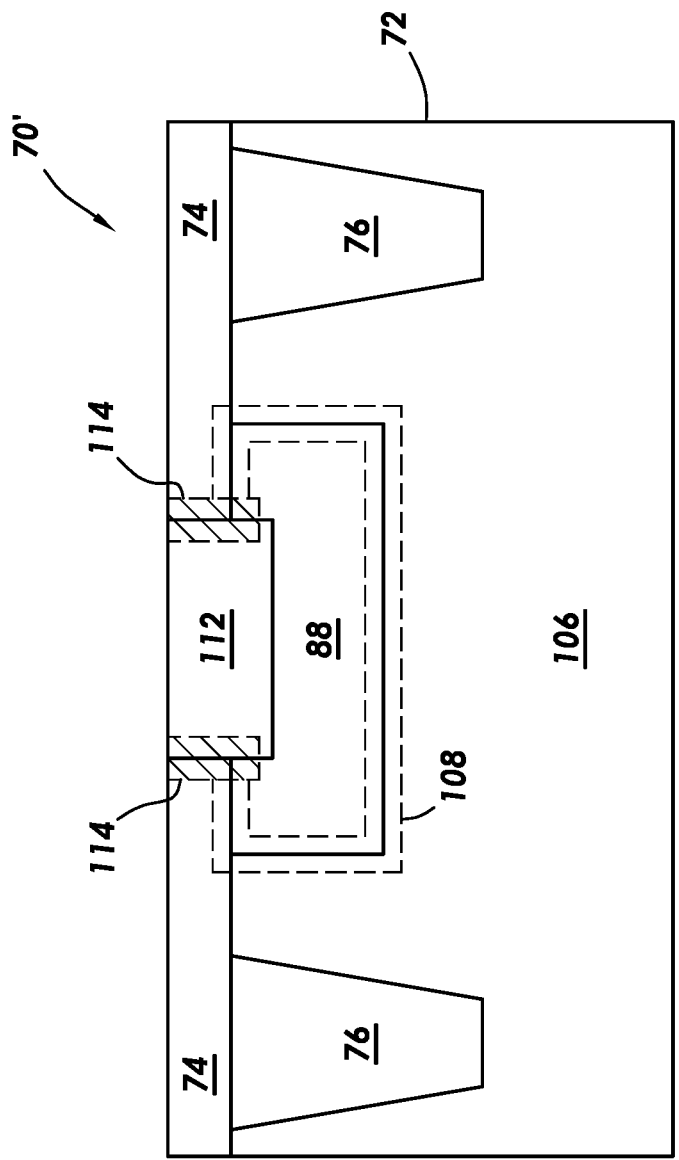
Figure 9:
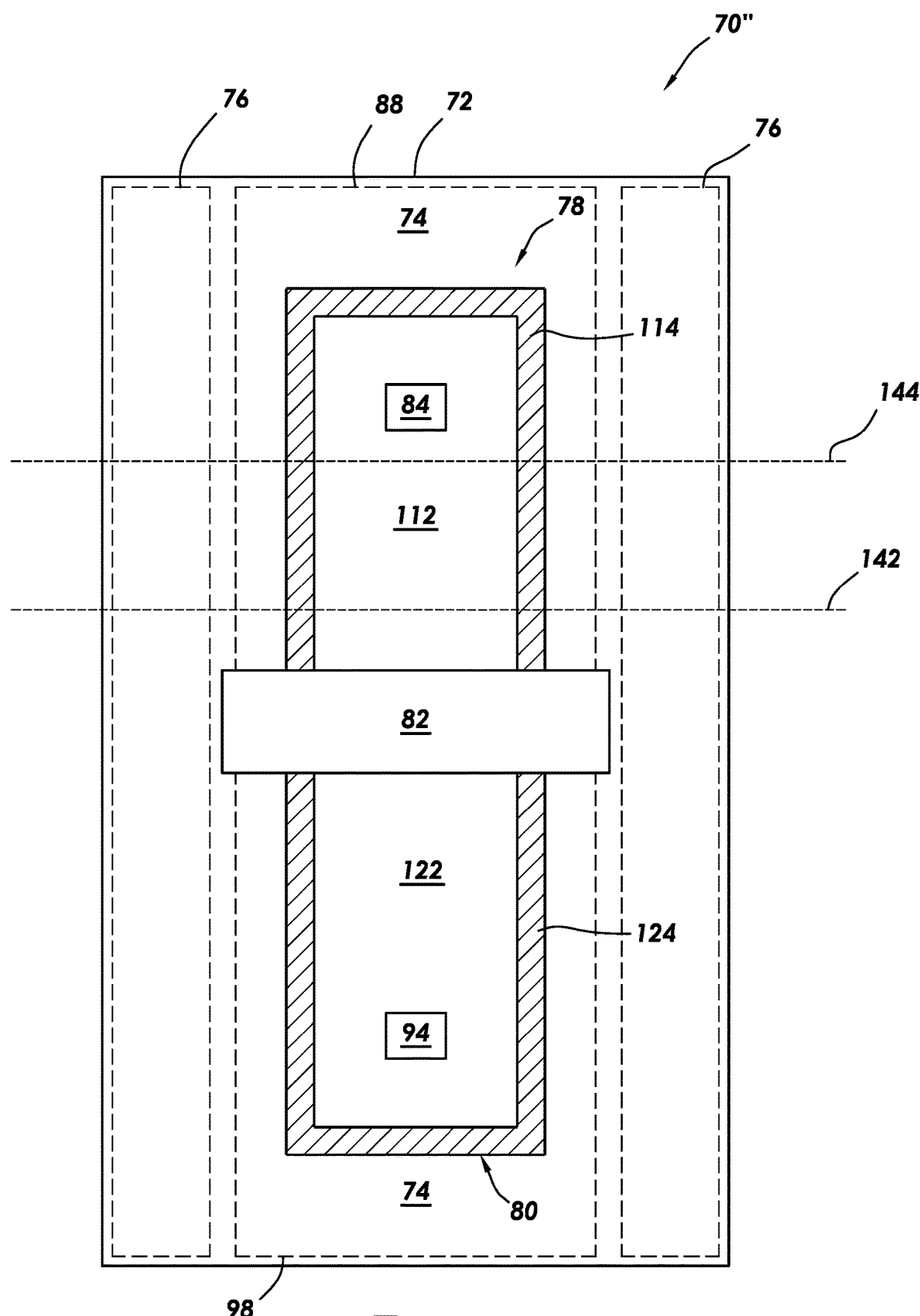
FIG. 9 is a diagram of illustrative transistor structures with a blanket surface implant region in a substrate having extended surface source-drain regions in accordance with some embodiments.

FIGS. 7 and 8 illustrative a first transistor configuration using a blanket surface implant layer 74, while FIG. 9 illustrates a second transistor configuration using a blanket surface implant layer 74.

The transistor features for transistor 70' in FIGS. 7 and 8 include some of the same or similar features as those for transistor 70 in FIGS. 4-6. Description of these same or similar features are omitted for the sake of clarity (e.g., in order to not unnecessarily obscure the embodiments of FIGS. 7 and 8). Unless otherwise specified, similarly labelled elements (e.g., elements having the same reference numerals) in the transistor depicted in FIGS. 7 and 8 may serve the same or similar functions, have the same or similar characteristics, and be formed or configured in the same or similar manners as described in connection with corresponding elements for transistor 70 in FIGS. 4-6. In particular, the transistor features for transistor 70' in FIGS. 7 and 8 that are different than those for transistor 70 in FIGS. 4-6 are further detailed below.

Referring first to FIG. 7, transistor 70' in FIG. 7 includes a surface implant layer 74 (sometimes referred to herein as a blanket surface implant region 74). Implant layer 74 may similarly (similar to the description for implant layer 74 in connection with FIG. 4) be disposed at the surface of substrate 72 and formed from a portion of semiconductor substrate 72 that is heavily doped and exhibits the first doping type (e.g., p-type). As an example, implant region 74 may be an implant region with p+ doping. In contrast to the description for implant layer 74 in connection with FIG. 4, implant layer 74 in FIG. 7 may be formed without the use of a masking layer over the pixel array. For example, the entire transistor area in substrate 72 (e.g., prior to the deposition or formation of contacts 84 and 94,) may be doped with or receive one or more dopants of the first type (e.g., via ion implantation or other doping processes) during the blanket surface implantation process used to form layer 74.

Accordingly, lightly doped implant regions 88 and 98 may be covered by the blanket surface implant layer 74 at the surface of substrate 72 such that no portion of lightly doped implant regions 88 and 98 are at the surface of substrate 72. Implant region 112 (instead of implant region 86 in FIG. 4) may be formed at the surface of substrate 72 to make contact with metal contact 84 and may overlap a portion of lightly doped implant region 88 at source-drain region 78. Implant region 122 (instead of implant region 96 in FIG. 4) may be formed at the surface of substrate 72 to make contact with metal contact 94 and may overlap a portion of lightly doped implant region 98 at source-drain region 80.

Implant regions 112 and 122 may be formed from respective portions of semiconductor substrate 72 that are moderately doped and exhibit the second doping type (e.g., n-type). As an example, implant regions 112 and 122 may each be an implant region with n doping. In one illustrative implementation, implant regions 112 and 122 may be more heavily doped with the second type of dopant (e.g., a n-type dopant), but following the blanket doping using the first type of dopant (e.g., a p-type dopant) for forming implant layer 74, implant regions 112 and 122 may be more moderately doped. Implant regions 112 and 122 may be formed and embedded in the surface of substrate 72 and may be laterally surrounded by surface implant layer 74. The lateral interface or junction between implant region 112 and implant region 74 may form surface depletion region 114. In other words, surface depletion region 114, shown in FIG. 7 as a shaded region, is formed from an interfacial portion of implant region 112 and an interfacial portion of implant region 74. The lateral interface or junction between implant region 122 and implant region 74 may form surface depletion region 124. In other words, surface depletion region 124, shown in FIG. 7 as a shaded region, is formed from an interfacial portion of implant region 122 and an interfacial portion of implant region 74.

The cross-sectional view of transistor 70' along line 132 may be the same or similar to the cross-sectional view of transistor 70 along line 102 as depicted in FIG. 5. The cross-sectional view of transistor 70' along line 134 is shown in FIG. 8.

As shown in FIG. 8, and similarly described in connection with FIGS. 4-6, transistor features may be formed well 106 (e.g., a p-type well). In contrast with transistor 70, transistor 70' includes a moderately doped implant region 112 at source-drain region 78 that is laterally surrounded by surface implant region 74. The junction between implant regions 112 and 74 forms surface depletion region 114. Implant regions 112 and 74 may extend across the surface of well 106 (e.g., the surface of substrate 72). Accordingly, lightly doped implant region 88 and its corresponding depletion region 108 may be entirely underneath implant regions 74 and 112 and surface depletion region 114.

While FIG. 8 illustrates a cross-sectional view associated with source-drain region 78, the corresponding portion of source-drain region 80 may have an analogous cross-sectional view.

The transistor features for transistor 70" in FIG. 9 include some of the same or similar features as those for transistor 70 in FIGS. 4-6 and transistor 70' in FIGS. 7 and 8. Description of these same or similar features are omitted for the sake of clarity (e.g., in order to not unnecessarily obscure the embodiments of FIG. 9). Unless otherwise specified, similarly labelled elements (e.g., elements having the same reference numerals) in the transistor depicted in FIG. 9 may serve the same or similar functions, have the same or similar characteristics, and be formed or configured in the same or similar manners as described in connection with corresponding elements for transistor 70 in FIGS. 4-6 and/or for transistor 70' in transistor of FIGS. 7 and 8. In particular, the transistor features for transistor 70" in FIG. 9 that are different than those for transistor 70 in FIGS. 4-6 and/or transistor 70' in FIGS. 7 and 8 are further detailed below.

As shown in FIG. 9, implant regions 112 and 122 for transistor 70" may be extended laterally toward the channel/gate region of the transistor (relative to implant regions 112 and 122 in FIG. 7). Accordingly, surface depletions regions 114 and 124 for transistor 70" may also extend laterally toward the channel/gate region of the transistor. Similar to the transistor configuration described in connection with FIGS. 7 and 8, lightly doped implant regions 88 and 98 may be covered by the blanket surface implant layer 74 and implant layers 112 and 122 at the surface of substrate 72 such that no portion of lightly doped implant regions 88 and 98 (or their corresponding depletion regions) are at the surface of substrate 72.

The cross-sectional view of transistor 70' along lines 142 and 144 may be the same or similar to each other and may be the same or similar to the cross-sectional view of transistor 70' along line 134 as depicted in FIG. 8.

The transistor features as shown in and described in connection with FIGS. 4-9 are merely illustrative. If desired, one or more elements may be added and/or omitted from the transistor configuration as depicted. In particular, the transistor features as shown and described in connection with FIGS. 4-9 may further include dielectric, polysilicon and metal layers on top of the semiconductor substrate as depicted. The metal contacts and the conductive gate structure may be formed from one or more portions of these metal and polysilicon layers separated by corresponding dielectric layers. If desired, additional isolation structures such as shallow trench isolation structures may be disposed in the substrate at the top and bottom of the transistor structures (e.g., top and bottom relative to the transistor configurations as depicted in FIGS. 4, 7, and 9).

The multiple implant layers or regions described in connection with FIGS. 4-9 may be formed in any suitable manner (e.g., using any suitable doping method). As examples, a diffusion process, an ion implantation process, and/or any other suitable doping process may be used to form these implant layers. One or more dopants of any suitable types (e.g., p-type dopants such as boron, indium, etc., n-type dopants such as phosphorus, arsenic, etc., or other types of dopants) may be used, separately or in combination, for each of these processes to achieve an overall type of doping (e.g., n-type or p-type) and an overall dose of doping (e.g., a high or heavy doping ('+') concentration such as a carrier concentration greater than $10^{18}$ cm$^{-3}$ or greater than $10^{17}$ cm$^3$, a low or light doping ('−') concentration such as a carrier concentration less than $10^{16}$ cm$^3$ or less than $10^{15}$ cm$^{-3}$, or a moderate doping concentration between high and low doping concentrations such as a carrier concentration between $10^{15}$ cm$^3$ and $10^{18}$ cm$^{-3}$, between $10^{16}$ cm$^{-3}$ and $10^{17}$ cm$^{-3}$, between $10^{16}$ cm$^{-3}$ and $10^{18}$ cm$^{-3}$, or between $10^{15}$ cm$^3$ and $10^{17}$ cm$^{-3}$). If desired, the blanket doping process used to form surface implant layer 74 in connection with FIGS. 7-9 may be performed across the pixel array.

In some illustrative configuration in which a transistor does not require access to (e.g., a metal contact to) a source-drain terminal, surface implant layer 74 may extend across the entirety of the substate surface in that source-drain region (e.g., implant regions, 86, 96, 112 and 122 may be omitted, and surface implant layer 74 may cover the entire surface of the source-drain terminal).

While transistors and their corresponding elements in FIGS. 4-9 are depicted as having rectangular outlines, this is merely illustrative. If desired, each transistor feature or structure (e.g., implant regions, isolation structures) may have any suitable shape insofar as suitable isolation and/or connections (coupling) as described herein are made.

In general, transistors 70, 70', and 70" as described in connection with FIGS. 4-9 may each be implemented in any suitable device or system. Configurations in which one of transistors 70, 70', or 70" is implemented as a gain control transistor (e.g., transistor 46 in FIG. 3) coupling a floating diffusion region to a charge storage structure within pixels in an image sensor pixel array are described herein as illustrative examples.

If desired, one or more other pixel transistors or other transistors in an image sensor or imaging system may implement one of transistors 70, 70', or 70". If desired, one or more transistors in a non-imaging system (e.g., a system without imaging capabilities) may implement one of transistors 70, 70', or 70".

Figure 10:
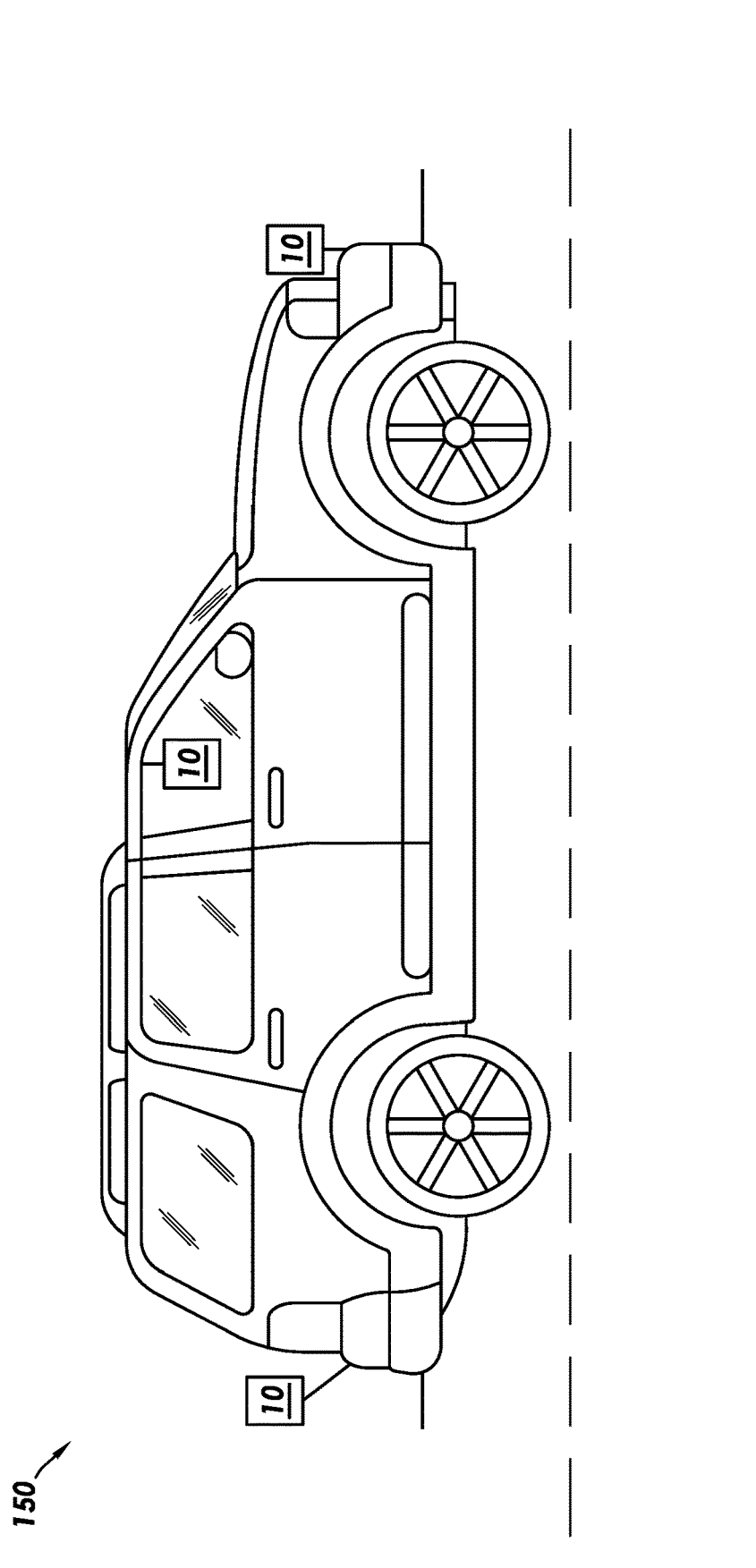
FIG. 10 is a diagram of an illustrative vehicle having one or more imaging systems in accordance with some embodiments.

In one illustrative example, imaging system 10 in FIG. 1, imaging module 12 in FIG. 1, image sensor 16 in FIG. 2, or pixel 22 in FIG. 3 implementing one or more of the transistor features described in connection with FIGS. 4-9 may be incorporated into a vehicle system such as in vehicle 150 in FIG. 10. As shown in the example of FIG. 10, vehicle 150 may include one or more imaging systems 10 (e.g., containing transistor structures described herein). The imaging systems may form part of a vehicular safety system or other vehicular system. Imaging systems 10 may be imaging systems with dedicated image capture and/or image processing functions. If desired, an imaging system 10 may perform some or all of the image processing functions associated with a given driver assist operation. A dedicated driver assist processor may receive signals from imaging systems 10.

In another suitable example, an imaging system 10 may perform only some or none of the image processing operations associated with a given driver assist function. For example, an imaging system 10 may merely capture images of the environment surrounding the vehicle 150 and transmit the image data to other dedicated and/or central processing circuitry for further processing. Such an arrangement may be used for vehicle safety system functions that require large amounts of processing power and memory (e.g., full-frame buffering and processing of captured images).

In the illustrative example of FIG. 10, a first imaging system 10 is shown mounted on the front of car 150 (e.g., to capture images of the surroundings in front of the car), and a second imaging system 10 is shown mounted in the interior of car 150 (e.g., to capture images of the driver of the vehicle). If desired, an imaging system 10 may be mounted at the rear end of vehicle 150 (i.e., the end of the vehicle opposite the location at which first imaging system 10 is mounted in FIG. 9). The imaging system at the rear end of the vehicle may capture images of the surroundings behind the vehicle. These examples are merely illustrative. One or more imaging systems 10 may be mounted on (e.g., on the exterior of and/or within) a vehicle 150 at any desired location(s).

Configurations in which one or more imaging systems containing pixels 22 and transistors 70, 70', or 70" described herein are placed with respect to a vehicle to assist in vehicular operation as described in connection with FIG. 9 are merely illustrative.

Various embodiments have been described illustrating transistor structures.

As an example, an image sensor pixel may include a photosensitive element, a floating diffusion region, and a transistor coupled to the floating diffusion region. The transistor may include a first source-drain region formed in a well of a first doping type, a second source-drain region formed in the well, and an implant layer at a surface of the well. The implant layer may have the first doping type and may overlap the first source-drain region and the second source drain region. The first source-drain region may include a lightly doped implant region of a second doping type within the well and overlapped by the implant layer. The image sensor pixel may further include isolation structures on opposing lateral sides of the lightly doped implant region. The lightly doped implant region may be separated from the isolation structures by portions of the well. The isolation structures may be embedded within the well and may have the first doping type. The implant layer may overlap the isolation structures and may be heavily doped. If desired, the first doping type may be p-type and the second doping type may be n-type.

As another example, an imaging system may include a charge storage structure, and a transistor having a source-drain region coupled to the charge storage structure. The source-drain region of the transistor may include a first implant region of a first doping type formed within a well of a second doping type, a second implant region of the first doping type that is surrounded by the first implant region and is disposed at a surface of the well, and an implant layer of the second doping type at the surface of the well, laterally surrounding the second implant region, and overlapping the first implant region. The second implant region may be more heavily doped than the first implant region. The implant layer may be more heavily doped than the well. The imaging system may further include an isolation structure of the second doping type within the well and separated from the first implant region by a portion of the well. The implant layer may be more heavily doped than the isolation structure. If desired, the source-drain region may further include a depletion region between the second implant region and the implant layer at the surface of the well. If desired, a portion of the first implant region may be disposed at the surface of the well between the second implant region and the implant layer. If desired, the imaging system may be configured to be an imaging system for a vehicle.

As yet another example, a transistor may include a well of a first doping type, a lightly doped drain region of a second doping type in the well, isolation structures of the first doping type on opposing lateral sides of the lightly doped drain region and separated from the lightly doped drain region, a heavily doped surface implant layer of the first doping type at a surface of the well and overlapping the lightly doped drain region and the isolation structure. The transistor may further include an implant region of the second doping type at the surface of the well and overlapping the lightly doped drain region, and a metal contact on the implant region. The heavily doped surface implant layer may laterally surround the implant region. If desired, the first doping type is p-type and the second doping type is n-type. If desired, the lightly doped drain region has a carrier concentration less than $10^{16}$ cm$^{-3}$ and the heavily doped surface implant layer has a carrier concentration greater than between $10^{17}$ cm$^{-3}$.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel comprising:
   a photosensitive element;
   a floating diffusion region; and
   a transistor coupled to the floating diffusion region, the transistor including:
   a first source-drain region for a first source-drain terminal of the transistor, wherein the first source-drain region is formed in a well of a first doping type;
   a second source-drain region for a second source-drain terminal of the transistor, wherein the second source-drain region is formed in the well; and
   an implant layer at a surface of the well, the implant layer having the first doping type and overlapping the first source-drain region and the second source drain region.

2. The image sensor pixel defined in claim 1, wherein the floating diffusion region is formed at one of the first or second source-drain regions of the transistor.

3. The image sensor pixel defined in claim 1, wherein the first source-drain region includes a lightly doped implant region of a second doping type within the well and overlapped by the implant layer.

4. The image sensor pixel defined in claim 3 further comprising:
   isolation structures on opposing lateral sides of the lightly doped implant region, wherein the lightly doped implant region is separated from the isolation structures by portions of the well.

5. The image sensor pixel defined in claim 4, wherein the isolation structures are embedded within the well and have the first doping type, and the implant layer overlaps the isolation structures.

6. The image sensor pixel defined in claim 3, wherein the first doping type is p-type and the second doping type is n-type.

7. The image sensor pixel defined in claim 1, wherein the implant layer is heavily doped.

8. An imaging system comprising:
   a charge storage structure; and
   a transistor having a source-drain region coupled to the charge storage structure, wherein the source-drain region includes:
   a first implant region of a first doping type formed within a well of a second doping type;
   a second implant region of the first doping type that is surrounded by the first implant region and is disposed at a surface of the well;
   an implant layer of the second doping type at the surface of the well, laterally surrounding the second implant region, and overlapping the first implant region and
   an isolation structure within the well and separated from the first implant region by a portion of the well, wherein the implant layer overlaps the isolation structure and the portion of the well.

9. The imaging system defined in claim 8, wherein the second implant region is more heavily doped than the first implant region.

10. The imaging system defined in claim 9, wherein the implant layer is more heavily doped than the well.

11. The imaging system defined in claim 9, wherein the isolation structure has the second doping type.

12. The imaging system defined in claim 11, wherein the implant layer is more heavily doped than the isolation structure.

13. The imaging system defined in claim 9, wherein a portion of the first implant region is disposed at the surface of the well between the second implant region and the implant layer.

14. The imaging system defined in claim 8, wherein the source-drain region is directly connected to the charge storage structure.

15. The imaging system defined in claim 8, wherein the imaging system is configured to be an imaging system for a vehicle.

16. A transistor comprising:
a well of a first doping type;
a lightly doped drain region of a second doping type in the well;
isolation structures of the first doping type on opposing lateral sides of the lightly doped drain region and separated from the lightly doped drain region;
a heavily doped surface implant layer of the first doping type at a surface of the well and overlapping the lightly doped drain region and the isolation structure; and
an implant region of the second doping type at the surface of the well and overlapping the lightly doped drain region.

17. The transistor defined in claim 16 further comprising:
a metal contact on the implant region.

18. The transistor defined in claim 16, wherein the heavily doped surface implant layer laterally surrounds the implant region.

19. The transistor defined in claim 16, wherein the first doping type is p-type and the second doping type is n-type.

20. The transistor defined in claim 16, wherein the lightly doped drain region has a carrier concentration less than $10^{16}$ cm$^{-3}$ and the heavily doped surface implant layer has a carrier concentration greater than $10^{17}$ cm$^{3}$.

\* \* \* \* \*